United States Patent
Hong et al.

(10) Patent No.: US 7,187,518 B2
(45) Date of Patent: Mar. 6, 2007

(54) FLEXIBLE PRINTED CIRCUIT FOR SPINDLE MOTOR AND DISK DRIVE HAVING THE SAME

(75) Inventors: Min-pyo Hong, Suwon-si (KR); Yong-kyu Byun, Yongin-si (KR); Jeong-seok Koh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 419 days.

(21) Appl. No.: 10/878,044

(22) Filed: Jun. 29, 2004

(65) Prior Publication Data

US 2005/0018352 A1 Jan. 27, 2005

(30) Foreign Application Priority Data

Jul. 24, 2003 (KR) ............... 10-2003-0051117

(51) Int. Cl.
*G11B 17/02* (2006.01)
*H01R 9/09* (2006.01)
*H02K 5/22* (2006.01)

(52) U.S. Cl. ............... 360/99.08; 360/98.07; 310/71; 439/329; 439/493

(58) Field of Classification Search ......... 360/98.07, 360/99.04, 99.08
See application file for complete search history.

(56) References Cited

U.S. PATENT DOCUMENTS

| | | | | |
|---|---|---|---|---|
| 5,064,377 A * | 11/1991 | Wood | .................... | 439/67 |
| 5,493,159 A * | 2/1996 | Norris | .................... | 310/71 |
| 5,705,868 A * | 1/1998 | Cox et al. | .................... | 310/71 |
| 5,862,011 A * | 1/1999 | Sega et al. | .................... | 360/98.01 |
| 6,091,572 A * | 7/2000 | Cox | .................... | 360/99.08 |
| 6,188,155 B1* | 2/2001 | Ishizuka et al. | .................... | 310/71 |
| 6,316,855 B1* | 11/2001 | Moosmann et al. | .................... | 310/71 |
| 6,433,956 B1* | 8/2002 | Peters et al. | .................... | 360/97.01 |
| 6,528,914 B2* | 3/2003 | Kloeppel et al. | .................... | 310/71 |
| 6,652,324 B2* | 11/2003 | Maiers et al. | .................... | 439/660 |
| 6,665,149 B2* | 12/2003 | Abe | .................... | 360/264.2 |
| 6,702,592 B1* | 3/2004 | Harden et al. | .................... | 439/78 |
| 6,875,026 B2* | 4/2005 | Lee et al. | .................... | 439/74 |
| 2002/0051351 A1* | 5/2002 | Maurer et al. | .................... | 361/772 |

* cited by examiner

*Primary Examiner*—Brian E. Miller
(74) *Attorney, Agent, or Firm*—Sughrue Mion, PLLC

(57) ABSTRACT

A flexible printed circuit (FPC), electrically connecting a spindle motor on a base of a disk drive with a printed circuit board (PCB) outside of the base, and a disk drive including the FPC, are provided. The FPC includes a wiring portion having one end connected to the spindle motor; a bonded portion connected to the other end of the wiring portion and attached to the base; electrode supports, each having a predetermined elasticity and extending from an outside edge of the bonded portion; a wiring disposed along the wiring portion and the bonded portion; and first electrodes disposed on the electrode supports and connected to the wiring. The first electrodes contact second electrodes disposed on the PCB due to the elasticities of the electrode supports. The disk drive allows the spindle motor to be electrically connected to the PCB using only the FPC, i.e., without using a separate connector.

28 Claims, 5 Drawing Sheets

FLEXIBLE PRINTED CIRCUIT FOR SPINDLE MOTOR AND DISK DRIVE HAVING THE SAME

BACKGROUND OF THE INVENTION

This application claims the priority of Korean Patent Application No. 2003-51117, filed on Jul. 24, 2003, in the Korean Intellectual Property Office, the disclosure of which is incorporated herein in its entirety by reference.

1. Field of the Invention

The present invention relates to a disk drive, and more particularly, to a flexible printed circuit (FPC) for electrically connecting a spindle motor of a disk drive to a printed circuit board (PCB), and a disk drive having the flexible printed circuit.

2. Description of the Related Art

A disk drive, which is one type of data storage device, reads data from and writes data onto a disk. For example, in a hard disk drive (HDD), when reading data stored on a disk or writing data to the disk, read/write heads mounted to an actuator move to the desired location on a recording surface of the rotating disk. In this case, the read/write heads are lifted from the recording surface at a predetermined distance.

The HDD includes a spindle motor for rotating a disk, to which power is typically supplied through a flexible printed circuit (FPC). That is, the FPC serves to electrically connect the spindle motor installed within the disk drive with a printed circuit board (PCB) installed outside the disk drive for driving and controlling the spindle motor.

While being fixedly connected to the spindle motor, the FPC is not affixed directly to the PCB. Fixedly connecting the spindle motor with the PCB by the FPC makes it difficult to assemble the disk drive. Thus, a conventional disk drive has a separate connector to connect the FPC to the PCB. Examples of a connector used in an FPC for a spindle motor have been disclosed in U.S. Pat. Nos. 5,705,868 and 6,528,914.

Since the conventional disk drive requires a separate connector in addition to the FPC for supplying power to the spindle motor, it has a complicated structure and high manufacturing costs and is difficult to assemble. In particular, a small disk drive typically carrying a 1-inch disk is used in portable electronic systems such as PDAs, camcorders, and MP3 players. Because the disk drive must be very compact and thin, it is hard to adopt a separate connector that takes up much space in addition to the FPC.

SUMMARY OF THE INVENTION

The present invention provides a flexible printed circuit (FPC) for a spindle motor having an integrated connector structure.

The present invention also provides a disk drive constructed to electrically connect a spindle motor to a printed circuit board (PCB) by the FPC.

According to an exemplary aspect of the present invention, there is provided an FPC for electrically connecting a spindle motor installed on a base of a disk drive with a PCB assembled outside of the base, the FPC including: a wiring portion having one end connected to the spindle motor; a bonded portion connected to the other end of the wiring portion and attached onto the surface of the base; a plurality of electrode supports, each having a predetermined elasticity, which extend from an outside edge of the bonded portion; a wiring disposed along the wiring portion and bonded portion; and a plurality of first electrodes disposed on the plurality of electrode supports, respectively, and connected to the wiring. The plurality of first electrodes contact a plurality of second electrodes disposed on the PCB, respectively, due to the elasticities of the plurality of electrode supports.

The plurality of electrode supports are disposed on substantially the same plane as the bonded portion, and pushed toward the PCB by protrusions projecting on the surface of the base when the bonded portion is attached to the surface of the base.

Each of the plurality of electrode supports may be bent at a predetermined angle toward the PCB from the edge of the bonded portion. The FPC may further include one or more reference holes for precisely positioning the flexible printed circuit on the surface of the base. In this case, the one or more reference holes may include a first reference hole formed in the center of the bonded portion and a second reference hole formed in the wiring portion.

The FPC may include: a base layer with a shape given by the wiring portion, the bonded portion, and the plurality of electrode supports, wherein the base layer has the wiring and the plurality of first electrodes on its top surface; a cover layer that sticks to the surfaces of the base layer and the wiring in such a way as to cover the wiring but expose the plurality of first electrodes to the outside; an elastic layer that is attached to the bottom of the base layer and has a predetermined elasticity and a shape corresponding to the bonded portion and the plurality of electrode supports; and an adhesion layer with a shape corresponding to the bonded portion, which is attached to the bottom of the elastic layer.

The elastic layer may be made from a plastic thin film having a thickness of several hundreds of micrometers, a sheet metal having a thickness of several tens to several hundreds of micrometers, or more preferably, a spring steel plate. The base layer and cover layer may be made from an insulating plastic thin film having a thickness of several micrometers to several tens of micrometers.

According to another exemplary aspect of the present invention, there is provided a disk drive having a base, a spindle motor mounted on the base, and a PCB assembled outside of the base, the disk drive further including: an FPC that electrically connects the spindle motor with the PCB and includes a wiring portion having one end connected to the spindle motor, a bonded portion connected to the other end of the wiring portion and attached onto the surface of the base, a plurality of electrode supports, which extend from an outside edge of the bonded portion, having a predetermined elasticity, a wiring disposed along the wiring portion and the bonded portion, and a plurality of first electrodes disposed on the plurality of electrode supports, respectively, and connected to the wiring; a plurality of protrusions that project from the surface of the base and push the plurality of electrode supports toward the PCB, respectively; and a plurality of second electrodes disposed at a location on a surface of the PCB opposite the surface of the base, wherein the location corresponds to that of the plurality of first electrodes. The plurality of first electrodes contact the plurality of second electrodes, respectively, due to the elasticities of the plurality of electrode supports.

Alternatively, the present invention may provide a disk drive having a base, a spindle motor mounted on the base, and a printed circuit board (PCB) assembled outside of the base, the disk drive further including: an FPC that electrically connects the spindle motor with the PCB and includes a wiring portion having one end connected to the spindle motor, a bonded portion connected to the other end of the wiring portion and attached onto the surface of the base, a plurality of electrode supports, which extend from an outside edge of the bonded portion, having a predetermined elasticity, a wiring disposed along the wiring portion and the bonded portion, and a plurality of first electrodes disposed on the plurality of electrode supports, respectively, and connected to the wiring; and a plurality of second electrodes disposed at a location on a surface of the PCB opposite the surface of the base, wherein the location corresponds to that of the plurality of first electrodes. In this case, each of the plurality of electrode supports is bent at a predetermined angle toward the PCB from the edge of the bonded portion, and the plurality of first electrodes contact the plurality of second electrodes, respectively, due to the elasticities of the plurality of electrode supports.

In addition, a plurality of protrusions project from the surface of the base and support the plurality of electrode supports, respectively. The FPC may include one or more reference holes for precisely positioning itself on the surface of the base, and the base may have one or more projecting bosses inserted into the one or more reference holes, respectively, on its surface. The one or more reference holes may include a first reference hole formed in the center of the bonded portion and a second reference hole formed in the wiring portion, and the one or more bosses may include first and second bosses fitted into the first and second reference holes, respectively. Furthermore, one or more pressure bumps are disposed at a position on the PCB corresponding to the bonded portion of the FPC and press the bonded portion.

The present invention allows a spindle motor to be electrically connected to a PCB only by an FPC, without the need for a separate connector, thus providing a more compact and slimmer small disk drive with a simple structure, which is easy to assemble and has reduced manufacturing costs.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
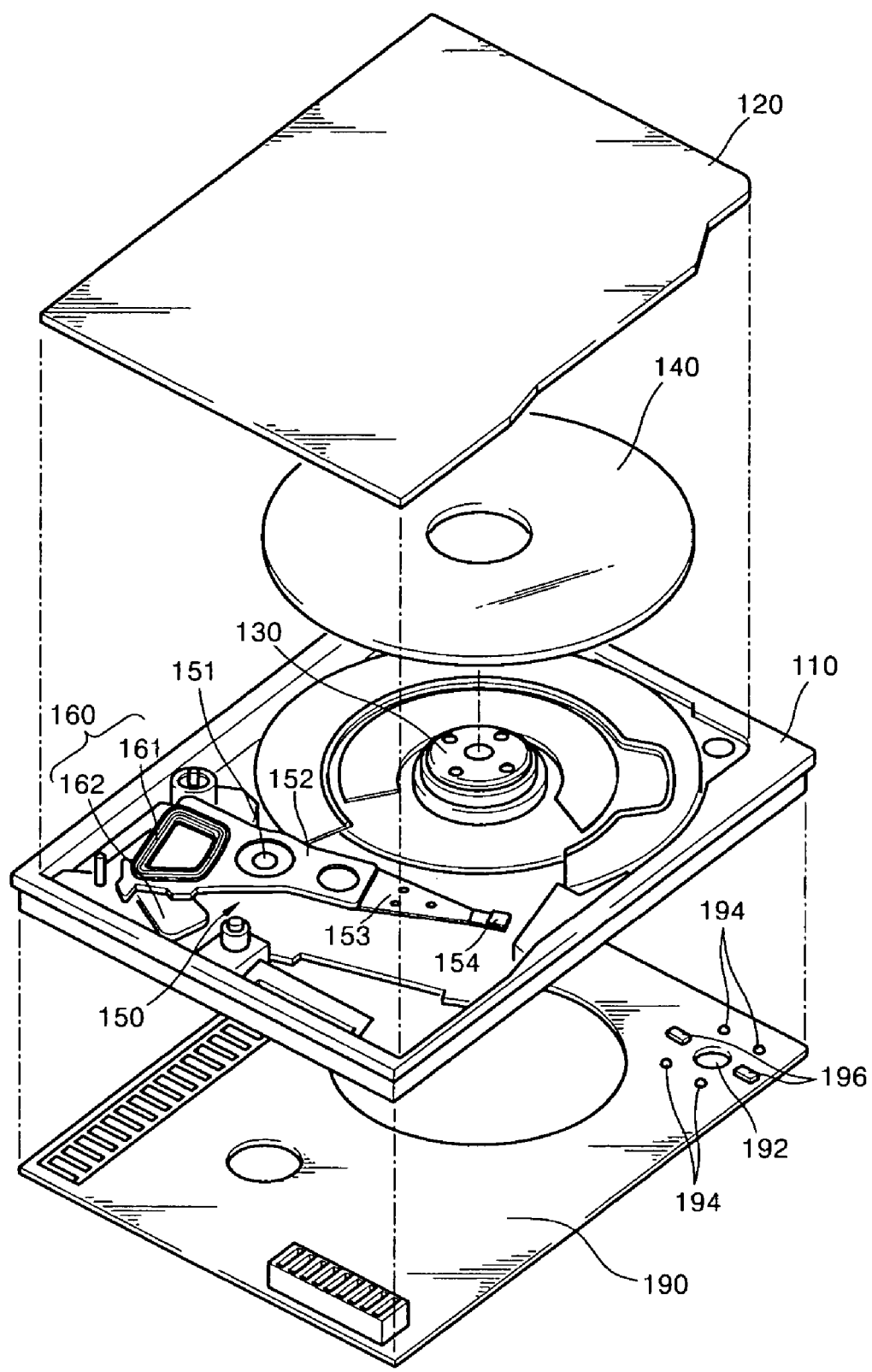
FIG. 1 is an exploded perspective view of a disk drive including a flexible printed circuit (FPC) according to an illustrative embodiment of the present invention.

Hereinafter, the present invention will be described in detail by explaining a flexible printed circuit (FPC) for a spindle motor and a disk drive including the same according to illustrative, non-limiting embodiments of the invention with reference to the attached drawings. Like reference numerals in the drawings denote like elements.

Figure 2:
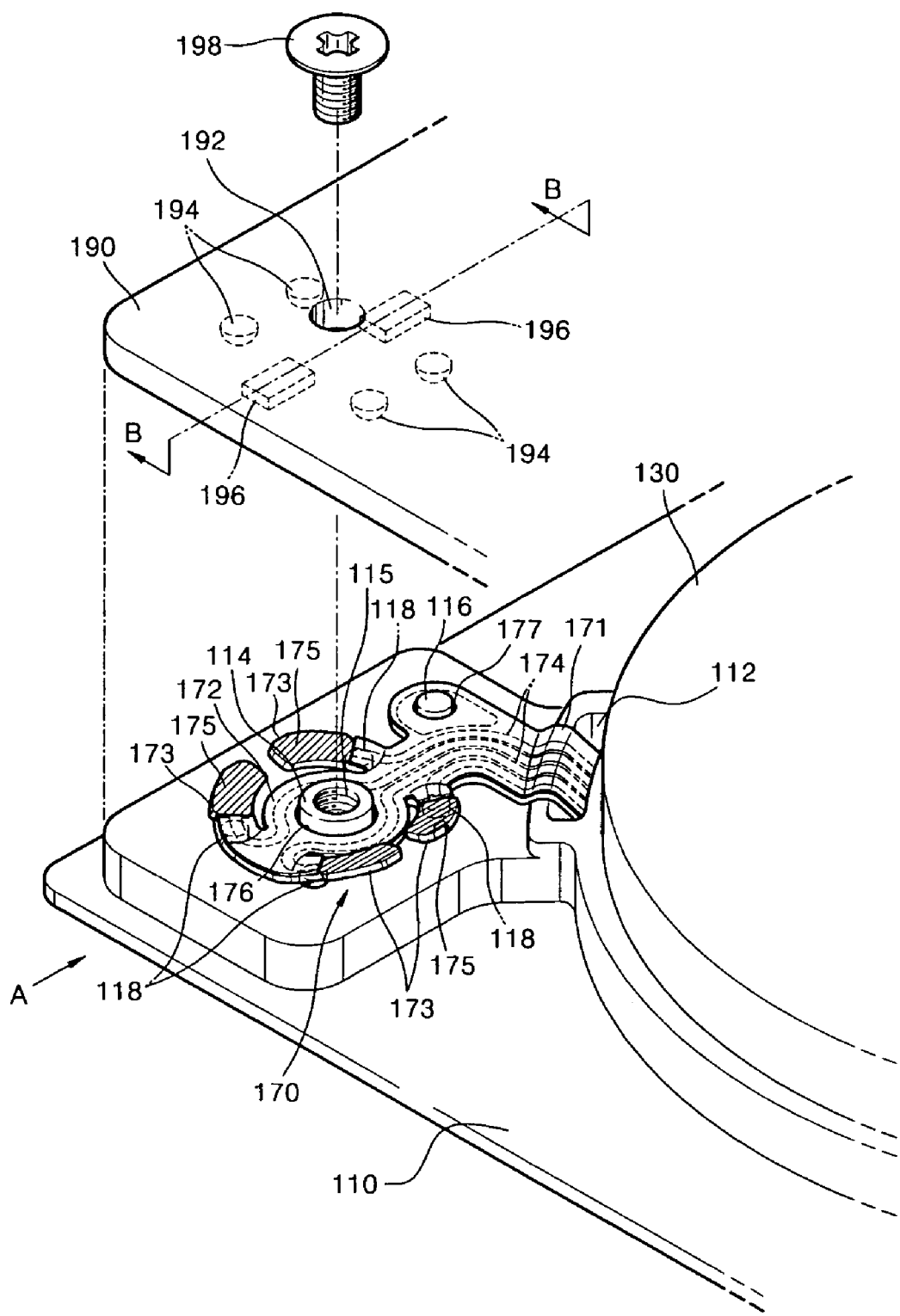
FIG. 2 is an inverted perspective view of the disk drive of FIG. 1 showing a portion where the FPC has been disposed.

Referring to FIGS. 1 and 2, a disk drive according to the present invention includes a base 110 and a cover 120. A spindle motor 130 for rotating a disk 140 and an actuator 150 for moving a read/write head 154 to the desired location on the disk 140 are mounted on the base 110. The cover 120 is mounted onto the base 110 and encloses the disk 140 and the actuator 150 for protection. The base 110 and the cover 120 are typically made of aluminum.

The actuator 150 is comprised of an actuator arm 152 that is rotatably fitted to an actuator pivot 151 mounted on the base 110 of the disk drive and a suspension 153 that is attached at one end of the actuator arm 152 and supports the read/write head 154 in such a way that the read/write head 154 is elastically biased toward the surface of the disk 140. The actuator 150 further includes a voice coil motor (VCM) 160 for rotating the actuator arm 152. The VCM 160 consists of a VCM coil 161 attached at the other end of the actuator arm 152 and a magnet 162 disposed opposite the VCM coil 161 on the base 110. The VCM 160 is controlled by a servo control system and rotates the actuator arm 152 in the direction determined by Fleming's left-hand rule due to interaction between current being applied to the VCM coil 161 and magnetic field created by the magnet 162.

More specifically, when the disk drive is turned on so that the disk 140 starts rotating, the VCM 160 turns the actuator arm 152 counterclockwise to allow the read/write head 154 to move over the recording surface of the disk 140. Conversely, when the disk drive is turned off so that the disk 140 stops rotating, the VCM 160 turns the actuator arm 152 clockwise to allow the read/write head 154 to move away from the disk 140.

The disk drive further includes a printed circuit board (PCB) 190 assembled outside of the base 110 and an FPC 170 that electrically connects the PCB 190 with the spindle motor 130. While one end of the FPC 170 is electrically connected to the spindle motor 130, in particular, a stator of the spindle motor 130, inside the disk drive through a slot 112 formed in the base 110, the other end is attached on the outside surface of the base 110. The FPC 170 includes a wiring portion 171, a bonded portion 172, and a plurality of electrode supports 173. One end of the wiring portion 171 is connected to the spindle motor 130 inside the disk drive, and the other end is drawn away from the disk drive through the slot 112.

The bonded portion 172 is attached onto the surface of the base 110 and connected to the other end of the wiring portion 171. A first reference hole 176 into which a first boss 114 is inserted may be formed in the center of the bonded portion 172. The first boss 114 projects from the surface of the base 110 to a predetermined height and has a threaded hole 115 in the center into which a screw 198 for fitting the PCB 190 to the base 110 is screwed. The FPC 170 can be precisely positioned at a fixed position by forming the first reference hole 176 in the bonded portion 172, into which the first boss 114 is inserted. A second boss 116 projects from the surface of the base 110 to a predetermined height, and the wiring portion 171 has a second reference hole 177 into which the second boss is inserted. The presence of the first and second bosses 114 and 116 and the first and second reference holes 176 and 177 allows the FPC 170 to be more precisely positioned at a fixed position.

The plurality of electrode supports 173, e.g., four electrode supports, extend from an outside edge of the bonded portion 172, each having a predetermined elasticity. When the bonded portion 172 is attached onto the surface of the base 110, the four electrode supports 173 are pushed toward the PCB 190 by protrusions 118 of a predetermined height projecting from the surface of the base 110. More specifically, each protrusion 118 is positioned adjacent to the root of corresponding electrode support 173 so that the electrode support 173 is pushed toward the PCB 190 by applying the principle of leverage. In this case, each electrode support 173 having a predetermined elasticity can be kept sloped at a predetermined angle with respect to the surface of the base 110.

Wiring 174 is disposed along the wiring portion 171 and the bonded portion 172, and each of a plurality of first electrodes 175 connected to the wiring 174 is disposed on each of the electrode supports 173. Each of the plurality of first electrodes 175 is preferably disposed adjacent to an end of a corresponding electrode support 173. The wiring 174 and the first electrodes 175 may be made of metal having high electrical conductivity such as copper. The wiring 174 is covered with a cover layer 184 (to be described later) for protection whereas the first electrodes 175 are exposed outside of the cover layer 184. Since the electrode supports 173 have been pushed toward the PCB 190 by the protrusions 118 as described above, each of the first electrodes 175 disposed on each of the electrode supports 173 is positioned closer to the PCB 190 than any other portion of the FPC 170.

As described above, the PCB 190 is attached to the base 110 with the screw 198. To this end, the PCB 190 has a screw insert hole 192 at a position corresponding to the threaded hole 115 formed in the base 110. The PCB 190 incorporates a drive circuit with a plurality of second electrodes 194 for driving the spindle motor 130. Each of the plurality of second electrodes 194 is disposed on a surface of the PCB 190 opposite the surface of the base 110, and in particular, opposite each of the plurality of the first electrodes 175 on the FPC 170. The second electrodes 194 may be formed by a solder projecting from the surface of the PCB 190 to a predetermined height.

The PCB 190 preferably further has pressure bumps 196 at a position corresponding to the bonded portion 172 of the FPC 170. The pressure bumps 196 may be formed by solders projecting from the surface of the PCB 190 to a predetermined height that is greater than that of the second electrodes 194. The pressure bumps 196 presses the bonded portion 172 of the FPC 170 when the PCB 190 is attached to the base 110, thus allowing the bonded portion 172 to remain firmly affixed to the surface of the base 110.

As described above, the disk drive does not require the use of a separate connector in addition to the FPC 170. That is, the disk drive according to the present invention is designed to electrically connect the spindle motor with the PCB 190 using the FPC 170 having an integrated connector structure.

Figure 3:
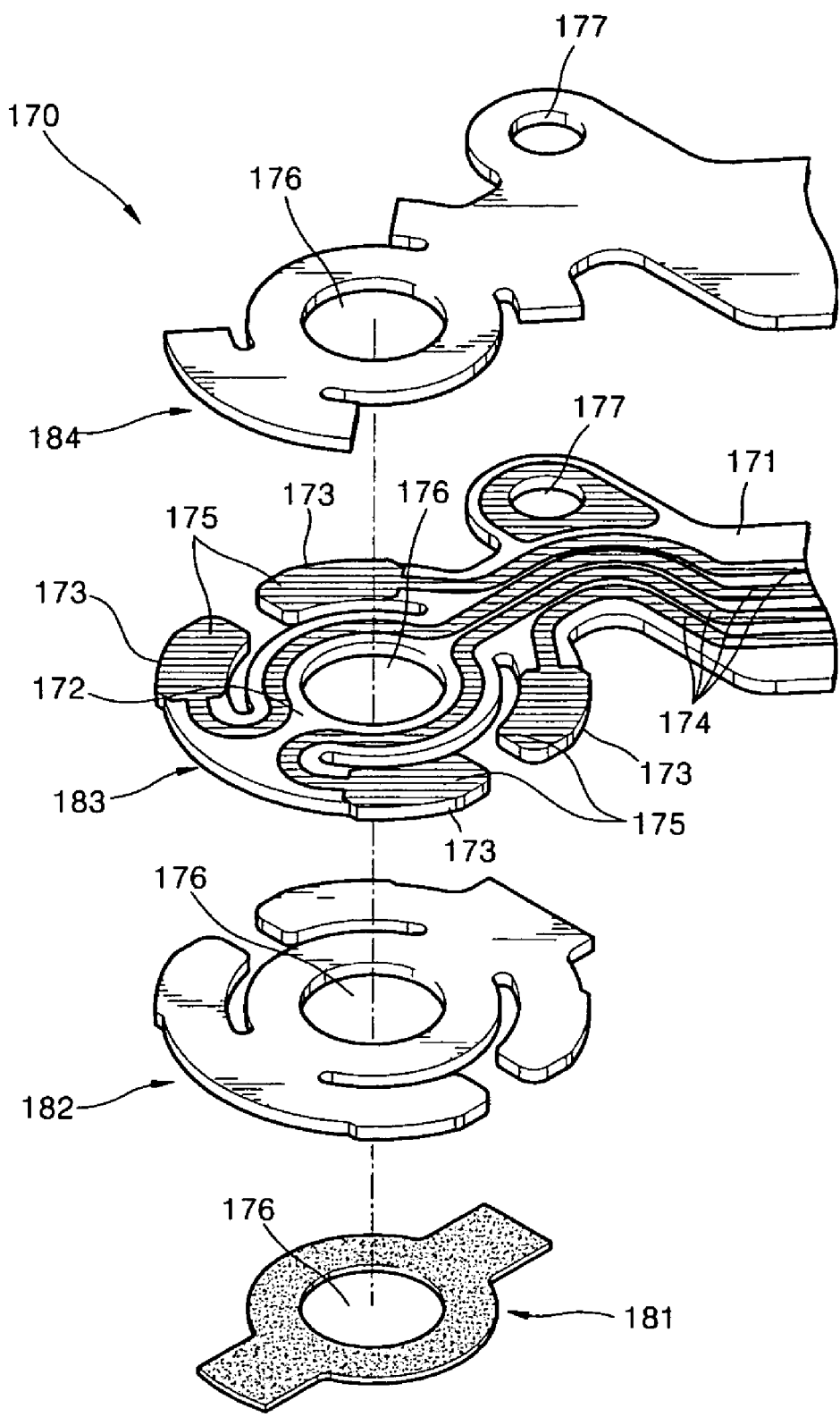
FIG. 3 is a perspective view with layers of the FPC shown in FIG. 2 broken away.

FIG. 3 is a perspective view with layers of the illustrative FPC 170 shown in FIG. 2 broken away. Referring to FIG. 3, the FPC 170 is made up of stacked multiple thin films. The multiple thin films include an adhesion layer 181, an elastic layer 182, a base layer 183, and a cover layer 184. The base layer 183 has a shape encompassing the wiring portion 171, the bonded portion 172, and the electrode supports 173. The wiring 174 and the first electrodes 175 are disposed on the top surface of the base layer 183. The base layer 183 may be formed from insulating plastic resin such as polyimide to a thickness of about several micrometers to several tens of micrometers.

The cover layer 184 is stacked onto the base layer 183 and exposes the first electrodes 175 to the outside while covering the wiring 174. The cover layer 184 may also be formed from insulating plastic resin such as polyimide to a thickness of about several tens to several hundreds of nanometers.

The base layer 183 and the cover layer 184 are bonded to each other with a predetermined adhesive. As described above, the base layer 183 and the cover layer 184 have the first and second reference holes 176 and 177, respectively.

The elastic layer 182 is attached to the bottom of the base layer 183 by a predetermined adhesive and disposed over the bonded portion 172 and the electrode supports 173. The elastic layer 182, which may be formed from plastic resin such as to a thickness of about several hundreds of micrometers, has a predetermined elasticity so that the electrode supports 173 remain sloped at the predetermined angle with respect to the surface of the base 110.

To attach the bonded portion 172 of the FPC 170 to the surface of the base 110, the adhesion layer 181 sticks to a portion of the bottom of the elastic layer 182 corresponding to the bonded portion 172. The adhesion layer 181 may be made of a predetermined adhesive or a commonly used double-sided tape. As described above, the elastic layer 182 and the adhesion layer 181 may have the first reference hole 176.

The FPC 170 made up of the stacked multiple layers 181–184 has a thickness of about 0.2 to 0.5 mm. The electrode supports 173 may be on the same plane as the bonded portion 172. In other words, each of the layers 181–184 may be planar. In this case, as described earlier, when the bonded portion 172 is attached to the base 110, the electrode supports 173 are pushed upward by the protrusions 118 so that they are deformed to be sloped at the predetermined angle with respect to the surface of the base 110.

Meanwhile, each of the electrode supports 173 may be bent at a predetermined angle toward the PCB 190 from the edge of the bonded portion 172. That is, a portion of the elastic layer 182 corresponding to the electrode supports 173 may be pre-bent, which means the electrode support 173 can remain sloped at a predetermined angle with respect to the surface of the base 110 without the protrusions 118. However, also in this case, it is preferable to include the protrusions 118 since the leverage effect acting in the protrusions 118 ensures contact between the first electrodes 175 disposed on the electrode supports 173 and the second electrodes 194 disposed on the PCB 190. The elastic layer 182 may be made from a sheet metal having higher elasticity so that it can be kept bent. For example, the sheet metal may be a thin spring steel plate having a thickness of several tens to several hundreds of micrometers.

Figure 4A:
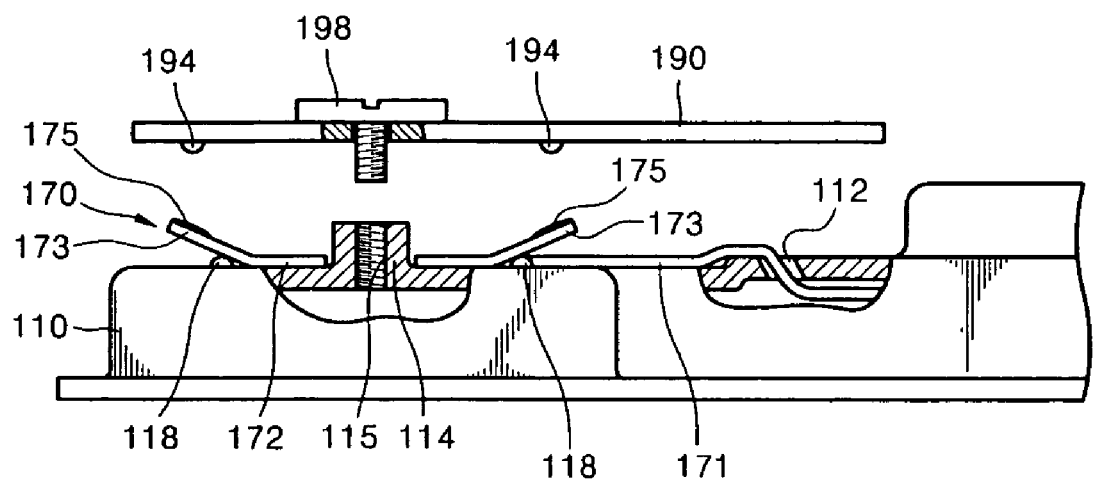
FIGS. 4A and 4B are partial side views of a disk drive taken in the direction A indicated in FIG. 2, and in particular, enlarged views of the FPC when the PCB has been separated from the base and when the FPC has been electrically connected to the PCB by mating the PCB to the base, respectively.
Figure 4B:
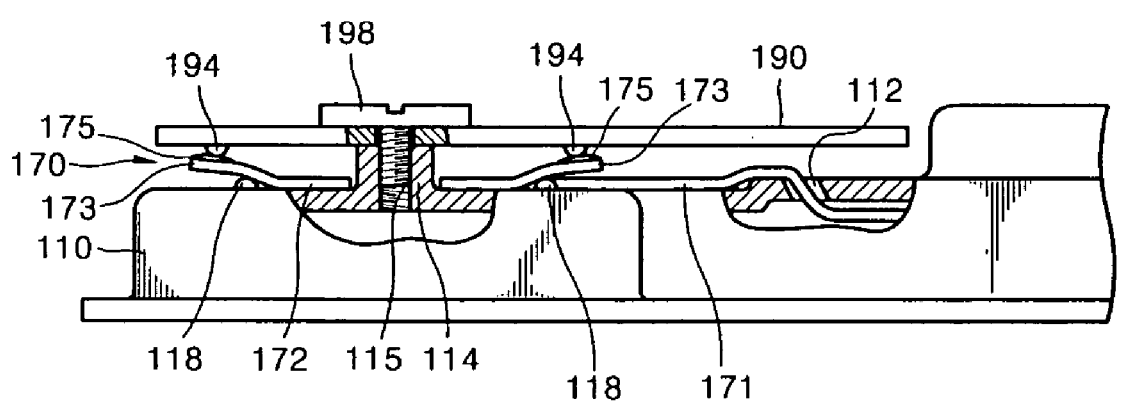

A mechanism for establishing an electrical connection between the FPC 170 and PCB 190 constructed above will now be described. FIGS. 4A and 4B are partial side views of the disk drive taken in the direction A indicated in FIG. 2, and in particular, enlarged views of the FPC 170 when the PCB 190 has been separated from the base 110 and when the FPC 170 has electrically been connected to the PCB 190 by mating the PCB 190 to the base 110, respectively.

First, referring to FIG. 4A, the wiring portion 171 of the FPC 170 connects to the spindle motor 130 inside the disk drive through the slot 112 that penetrates into the base 110, and the bonded portion 172 of the FPC 170 is attached onto the surface of the base 110. The electrode supports 173 are pushed toward the PCB 190 by corresponding protrusions 118. In this case, an end of each of the electrode supports 173 having a predetermined elasticity is not bent downward but remains sloped at a predetermined angle with respect to the surface of the base 110. As described above, when each of the electrode supports 173 is pre-bent toward the PCB 190, it can be kept sloped at a predetermined angle relative to the surface of the base 110 in the absence of the protrusions 118.

Then, referring to FIG. 4B, when the PCB 190 is fitted into the base 110 using the screw 198, each of the second electrodes 194 disposed on the surface of the PCB 190 comes into contact with corresponding first electrode 175 disposed on the electrode support 173 of the FPC 170 opposite the surface of the PCB 190. Specifically, the first electrodes 175 press the second electrodes 194, respectively, and then both contact each other due to the elasticity of the electrode supports 173. Furthermore, a leverage force generated by the protrusions 118 ensures the contact between the first and second electrodes 175 and 194.

As described above, since the FPC 170 of the disk drive according to the present invention has a connector structure, it is possible for the first electrodes 175 disposed on the FPC 170 to contact the second electrodes 194 disposed on the PCB 190 without the need for a separate connector, thus providing electrical conductivity between the FPC 170 and the PCB 190.

Figure 5:
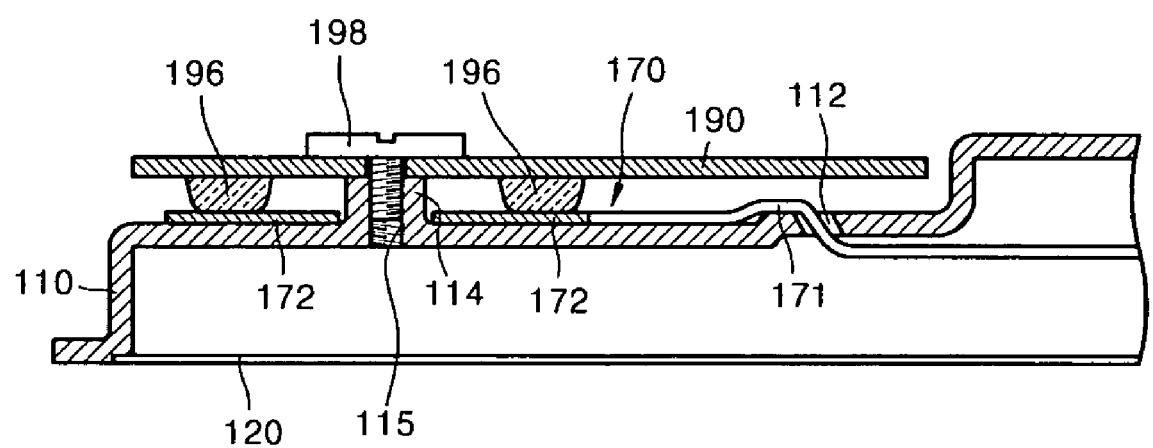
FIG. 5 is a partial cross-sectional view of the disk drive taken along line B–B' of FIG. 2, in which the PCB has been assembled into the base.

FIG. 5 is a partial cross-sectional view of the disk drive taken along line B-B' of FIG. 2, in which the PCB 190 has been assembled into the base 110. When the PCB 190 is fitted into the base 110 with the screw 198, the pressure bumps 196 disposed on the PCB 190 press the bonded portion 172 toward the base 110, thus allowing the bonded portion 170 to become firmly affixed to the surface of the base 110. Thus, it is possible to prevent separation of the bonded portion 172 from the surface of the base 110 when the protrusions 118 push upward the electrode supports 173.

An FPC of the present invention having an integrated connector structure allows an electrical connection between a spindle motor and a PCB without the need for a separate connector, thus providing a more compact and slimmer small disk drive with a simple structure, which is easy to assemble, and reduced manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, while the present invention has been described in reference to an FPC being applied to a hard disk drive, the FPC could also be applied to an optical disk drive having a spindle motor. Additionally, each layer of the FPC may be made of various other materials that can achieve the same functions in addition to those expressly described herein.

What is claimed is:

1. A flexible printed circuit for electrically connecting a spindle motor mounted on a base of a disk drive with a printed circuit board outside of the base, the flexible printed circuit comprising:
    a wiring portion having one end connected to the spindle motor;
    a bonded portion connected to the other end of the wiring portion and attached onto a surface of the base;
    a plurality of electrode supports, each having a predetermined elasticity and extending from an outside edge of the bonded portion;
    a wiring disposed along the wiring portion and the bonded portion; and
    a plurality of first electrodes disposed on the plurality of electrode supports, respectively, and connected to the wiring,
    wherein the plurality of first electrodes contact a plurality of second electrodes disposed on the printed circuit board, respectively, due to the elasticities of the plurality of electrode supports.

2. The flexible printed circuit of claim 1, wherein the plurality of electrode supports are disposed on substantially the same plane as the bonded portion, and pushed toward the printed circuit board by one or more protrusions projecting from the surface of the base when the bonded portion is attached onto the surface of the base.

3. The flexible printed circuit of claim 1, wherein each of the plurality of electrode supports is bent at a predetermined angle toward the printed circuit board from the edge of the bonded portion.

4. The flexible printed circuit of claim 1, further comprising one or more reference holes for precisely positioning the flexible printed circuit on the surface of the base.

5. The flexible printed circuit of claim 4, wherein the one or more reference holes comprise a first reference hole formed in the center of the bonded portion and a second reference hole formed in the wiring portion.

6. The flexible printed circuit of claim 1, comprising:
    a base layer with a shape given by the wiring portion, the bonded portion, and the plurality of electrode supports, wherein the wiring and the plurality of first electrodes are on a top surface of the base layer;
    a cover layer that sticks to at least the top surface of the base layer and the wiring to cover the wiring but expose the plurality of first electrodes to the outside;
    an elastic layer that is attached to a bottom surface of the base layer and has a predetermined elasticity and a shape corresponding to the bonded portion and the plurality of electrode supports; and
    an adhesion layer with a shape corresponding to the bonded portion, which is attached to a bottom surface of the elastic layer.

7. The flexible printed circuit of claim 6, wherein the elastic layer is made from a plastic thin film having a thickness of several hundreds of micrometers.

8. The flexible printed circuit of claim 6, wherein the elastic layer is made from a sheet metal having a thickness of several tens to several hundreds of micrometers.

9. The flexible printed circuit of claim 8, wherein the elastic layer is made from a spring steel plate.

10. The flexible printed circuit of claim 6, wherein the base layer and cover layer are made from an insulating plastic thin film having a thickness of several micrometers to several tens of micrometers.

11. A disk drive including a base, a spindle motor mounted on the base, and a printed circuit board outside of the base, the disk drive comprising:
    a flexible printed circuit that electrically connects the spindle motor with the printed circuit board and includes a wiring portion having one end connected to the spindle motor; a bonded portion connected to the other end of the wiring portion and attached onto the surface of the base; a plurality of electrode supports, each electrode support extending from an outside edge of the bonded portion and having a predetermined elasticity; a wiring disposed along the wiring portion and the bonded portion; and a plurality of first electrodes disposed on the plurality of electrode supports, respectively, and connected to the wiring;
    a plurality of protrusions that project from the surface of the base, each protrusion pushing a corresponding electrode support toward the printed circuit board; and
    a plurality of second electrodes disposed at a location on a surface of the printed circuit board opposite the surface of the base, wherein the location corresponds to that of the plurality of first electrodes, wherein the plurality of first electrodes contact the plurality of second electrodes, respectively, due to the elasticities of the plurality of electrode supports.

12. The disk drive of claim 11, wherein the flexible printed circuit comprises:
a base layer with a shape given by the wiring portion, the bonded portion, and the plurality of electrode supports, wherein the wiring and the plurality of first electrodes are on a top surface of the base layer;
a cover layer that sticks to at least the top surface of the base layer and the wiring to cover the wiring but expose the plurality of first electrodes to the outside;
an elastic layer that is attached to a bottom surface of the base layer and has a predetermined elasticity and a shape corresponding to the bonded portion and the plurality of electrode supports; and
an adhesion layer with a shape corresponding to the bonded portion, which is attached to a bottom surface of the elastic layer.

13. The disk drive of claim 12, wherein the elastic layer is made from a plastic thin film having a thickness of several hundreds of micrometers.

14. The disk drive of claim 12, wherein the flexible printed circuit has a thickness of approximately 0.2 mm to 0.5 mm.

15. The disk drive of claim 11, wherein the flexible printed circuit comprises one or more reference holes for precisely positioning the flexible printed circuit on the surface of the base, and the base has one or more projecting bosses for inserting into the one or more reference holes, respectively, on its surface.

16. The disk drive of claim 15, wherein the one or more reference holes comprise a first reference hole formed in the center of the bonded portion and a second reference hole formed in the wiring portion, and the one or more bosses comprise first and second bosses for fitting into the first and second reference holes, respectively.

17. The disk drive of claim 16, wherein the first boss has a threaded hole in the center, into which a screw for securing the printed circuit board to the base is inserted.

18. The disk drive of claim 11, wherein at least one pressure bump is disposed at a position on the printed circuit board corresponding to the bonded portion of the flexible printed circuit and presses the bonded portion.

19. A disk drive including a base, a spindle motor mounted on the base, and a printed circuit board outside of the base, the disk drive comprising:
a flexible printed circuit that electrically connects the spindle motor with the printed circuit board and includes a wiring portion having one end connected to the spindle motor; a bonded portion connected to the other end of the wiring portion and attached onto the surface of the base; a plurality of electrode supports, each electrode support extending from an outside edge of the bonded portion and having a predetermined elasticity; a wiring disposed along the wiring portion and the bonded portion; and a plurality of first electrodes disposed on the plurality of electrode supports, respectively, and connected to the wiring; and a plurality of second electrodes disposed at a location on a surface of the printed circuit board opposite the surface of the base, wherein the location corresponds to that of the plurality of first electrodes, wherein each electrode support is bent at a predetermined angle toward the printed circuit board from the edge of the bonded portion, and the plurality of first electrodes contact the plurality of second electrodes, respectively, due to the elasticities of the plurality of electrode supports.

20. The disk drive of claim 19, wherein the flexible printed circuit comprises:
a base layer with a shape given by the wiring portion, the bonded portion, and the plurality of electrode supports, wherein the wiring and the plurality of first electrodes are on a top surface of the base layer;
a cover layer that sticks to at least the top surface of the base layer and the wiring to cover the wiring but expose the plurality of first electrodes to the outside;
an elastic layer that is attached to a bottom surface of the base layer and has a predetermined elasticity and a shape corresponding to the bonded portion and the plurality of electrode supports; and
an adhesion layer with a shape corresponding to the bonded portion, which is attached to a bottom surface of the elastic layer.

21. The disk drive of claim 20, wherein the elastic layer is made from a sheet metal having a thickness of several tens to several hundreds of micrometers.

22. The disk drive of claim 20, wherein the flexible printed circuit has a thickness of approximately 0.2 mm to 0.5 mm.

23. The disk drive of claim 21, wherein the elastic layer is made from a spring steel plate.

24. The disk drive of claim 19, wherein a plurality of protrusions project from the surface of the base and support the plurality of electrode supports, respectively.

25. The disk drive of claim 19, wherein the flexible printed circuit comprises one or more reference holes for precisely positioning the flexible printed circuit on the surface of the base, and the base has one or more projecting bosses for inserting into the one or more reference holes, respectively, on its surface.

26. The disk drive of claim 25, wherein the one or more reference holes comprise a first reference hole formed in the center of the bonded portion and a second reference hole formed in the wiring portion, and the one or more bosses comprise first and second bosses for fitting into the first and second reference holes, respectively.

27. The disk drive of claim 26, wherein the first boss has a threaded hole in the center, into which a screw for securing the printed circuit board to the base is inserted.

28. The disk drive of claim 19, wherein at least one pressure bump is disposed at a position on the printed circuit board corresponding to the bonded portion of the flexible printed circuit and presses the bonded portion.

* * * * *